United States Patent
Okamoto

(10) Patent No.: US 9,282,628 B2
(45) Date of Patent: Mar. 8, 2016

(54) COMPONENT BUILT-IN BOARD AND METHOD OF MANUFACTURING THE SAME

(71) Applicant: FUJIKURA LTD., Tokyo (JP)

(72) Inventor: Masahiro Okamoto, Tokyo (JP)

(73) Assignee: FUJIKURA LTD., Tokyo (JP)

( * ) Notice: Subject to any disclaimer, the term of this patent is extended or adjusted under 35 U.S.C. 154(b) by 146 days.

(21) Appl. No.: 14/157,669

(22) Filed: Jan. 17, 2014

(65) Prior Publication Data

US 2014/0202741 A1    Jul. 24, 2014

(30) Foreign Application Priority Data

Jan. 18, 2013    (JP) .................. 2013-007797

(51) Int. Cl.
| | |
|---|---|
| H05K 1/02 | (2006.01) |
| H05K 1/18 | (2006.01) |
| H01L 23/538 | (2006.01) |
| H05K 3/40 | (2006.01) |
| H05K 3/42 | (2006.01) |
| H05K 3/46 | (2006.01) |
| H01L 23/498 | (2006.01) |

(52) U.S. Cl.
CPC .......... *H05K 1/0206* (2013.01); *H01L 23/5389* (2013.01); *H05K 1/186* (2013.01); *H01L 23/49822* (2013.01); *H01L 23/49827* (2013.01); *H01L 2224/18* (2013.01); *H01L 2924/0002* (2013.01); *H05K 3/4069* (2013.01); *H05K 3/429* (2013.01); *H05K 3/4614* (2013.01); *H05K 3/4697* (2013.01); *H05K 2201/0154* (2013.01); *Y10T 29/49139* (2015.01)

(58) Field of Classification Search
CPC ....... H05K 1/0206; H05K 1/186; H05K 3/30; H01L 23/5389
USPC ............................................. 174/252; 29/837
See application file for complete search history.

(56) References Cited

U.S. PATENT DOCUMENTS

| | | | |
|---|---|---|---|
| 5,106,461 A * | 4/1992 | Volfson et al. ................ 205/125 |
| 6,969,154 B2 * | 11/2005 | Takeuchi et al. ................ 347/59 |
| 2005/0073044 A1 * | 4/2005 | Tomabechi et al. ........... 257/720 |

FOREIGN PATENT DOCUMENTS

| | | |
|---|---|---|
| JP | 2001-244638 A | 9/2001 |
| JP | 2006-41242 A | 2/2006 |

(Continued)

OTHER PUBLICATIONS

Japanese Patent Application No. 2012-045721 filing date of Mar. 1, 2012, which was withdrawn without being published and which is the earliest application to which foreign patent document No. 1 JP2013-211526 claims priority.

*Primary Examiner* — Timothy Thompson
*Assistant Examiner* — Charles Pizzuto
(74) *Attorney, Agent, or Firm* — Westerman, Hattori, Daniels & Adrian, LLP

(57) ABSTRACT

A component built-in board, wherein at least two layers of a plurality of printed wiring bases are disposed on a rear surface side of an electronic component; the at least two layers of the printed wiring bases include a heat radiation-dedicated wiring pattern that is disposed above the rear surface of the electronic component; the heat radiation-dedicated wiring pattern is formed such that a heat radiation-dedicated wiring line and a signal-dedicated wiring line are continuous; a via includes a plurality of heat radiation-dedicated vias which connects the rear surface of the electronic component and the heat radiation-dedicated wiring pattern; and the heat radiation-dedicated wiring pattern is continuous from a place where connected to the heat radiation-dedicated via to be connected also to another via disposed at an outer peripheral side of the electronic component.

6 Claims, 6 Drawing Sheets

(56) References Cited

FOREIGN PATENT DOCUMENTS

| JP | 2006-310541 A | 11/2006 |
|----|---------------|---------|
| JP | 2007-535156 A | 11/2007 |
| JP | 2008-159682 A | 7/2008 |
| JP | 2011-515862 A | 5/2011 |
| JP | 2011-228631 A | 11/2011 |
| JP | 2013-211526 A | 10/2013 |
| WO | 2005/104635 A | 11/2005 |

* cited by examiner

COMPONENT BUILT-IN BOARD AND METHOD OF MANUFACTURING THE SAME

CROSS-REFERENCE TO RELATED APPLICATIONS

This application is based upon and claims the benefit of priority from the prior Japanese Patent Application No. 2013-7797, filed on Jan. 18, 2013, the entire contents of which are incorporated herein by reference.

STATEMENT REGARDING PRIOR DISCLOSURES BY THE INVENTOR OR A JOINT INVENTOR UNDER 37 C.F.R. 1.77(b) (6)

Japanese Patent Application Publication No. 2013-211526 A was published on Oct. 10, 2013. The inventor of the Japanese Patent Application Publication No. 2013-211526 A is Masahiro Okamoto who is the inventor of the present application. The applicant, Fujikura Ltd., of the Japanese Patent Application Publication No. 2013-211526 A is an assignee who obtained the invention of the Japanese Patent Application Publication from the present inventor. A copy of the Japanese Patent Application Publication is provided on a concurrently filed Information Disclosure Statement pursuant to the guidance of 78 Fed. Reg. 11076 (Feb. 14, 2013).

BACKGROUND OF THE INVENTION

1. Field of the Invention

This invention relates to a component built-in board having an electronic component built in thereto, and a method of manufacturing the same.

2. Description of the Prior Art

A known countermeasure for heat radiation from a board having an electronic component mounted thereon or built in thereto is, for example, a structure such as that of the ceramic wiring board disclosed in Japanese Unexamined Patent Application Publication No. 2006-41242 A described below. This ceramic wiring board includes a heat radiation-dedicated via (thermal via) formed penetrating in a substantially vertical direction from a front surface to a rear surface of an insulating base. Moreover, in the ceramic wiring board, a diameter of a heat radiation-dedicated via on a front surface side at a place where the electronic component is mounted is formed smaller than a diameter of another heat radiation-dedicated via. This is said to result in unevenness of the board being absorbed by a difference in level of heat radiation-dedicated vias of different diameters while heat radiation properties are maintained, whereby flatness of a board front surface overall can be secured.

However, in the heat radiation countermeasure of conventional technology disclosed in above-described Japanese Unexamined Patent Application Publication No. 2006-41242 A, the diameter of the heat radiation-dedicated via directly connected to the electronic component is small, hence it is difficult to say that the countermeasure is a structure where heat from the electronic component is necessarily transferred efficiently. Moreover, there is a problem that when the number of heat radiation-dedicated vias of small diameter is increased in order to improve heat radiation characteristics, processing steps become complicated and there is a limit to processing accuracy, hence not such a large improvement in heat radiation characteristics can be expected. Furthermore, the above-described structure is assumed to be even less effective particularly in a component built-in board having an electronic component built in thereto.

SUMMARY OF THE INVENTION

This invention has an object of overcoming the above-mentioned problems due to the conventional technology to provide a component built-in board capable of having heat radiation characteristics improved by a simple structure, and a method of manufacturing the component built-in board.

A component built-in board according to an embodiment of the present invention, the component built-in board having stacked therein a plurality of printed wiring bases in which a wiring pattern and a via are formed on/in an insulating base and the component built-in board being configured having an electronic component built in thereto, wherein at least two layers of the plurality of printed wiring bases are disposed on a rear surface side which is an opposite side to an electrode formation surface side of the electronic component; the at least two layers of the printed wiring bases disposed on the rear surface side of the electronic component include a heat radiation-dedicated wiring pattern as the wiring pattern that is disposed in multiple layers via the insulating base on a region above the rear surface of the electronic component; the heat radiation-dedicated wiring pattern is formed such that a heat radiation-dedicated wiring line and a signal-dedicated wiring line are continuous; the via includes a plurality of heat radiation-dedicated vias that are disposed on the region above the rear surface to connect the rear surface of the electronic component and the heat radiation-dedicated wiring pattern disposed in multiple layers; and the heat radiation-dedicated wiring pattern is continuous from a place where connected to the heat radiation-dedicated via to be connected also to another via disposed at an outer peripheral side of the electronic component.

The component built-in board according to the embodiment of the present invention results in the following, namely that at least two layers of printed wiring bases are disposed on a rear surface side which is an opposite side to an electrode formation surface side of an electronic component, that included on/in these printed wiring bases are multiple layers of a heat radiation-dedicated wiring pattern and a plurality of heat radiation-dedicated vias connected to the rear surface of the electronic component and the heat radiation-dedicated wiring pattern, and that the heat radiation-dedicated wiring pattern is formed such that a heat radiation wiring line and a signal-dedicated wiring line are continuous and is continuous from a place where connected to the heat radiation-dedicated via to be connected also to another via disposed at an outer peripheral side of the electronic component, hence the component built-in board according to the embodiment of the present invention makes it possible to achieve an even higher degree of density and an even lower profiling of the board overall without sacrificing heat radiation characteristics, makes it possible to raise heat radiation efficiency by increasing substantive heat radiation area, and makes it possible to further increase a heat radiation effect by combination with another via, thereby enabling heat radiation characteristics to be further improved.

In an embodiment of the component built-in board, the heat radiation-dedicated via has a larger diameter than the other via. Note that if the heat radiation-dedicated via is formed in the same process as the formation process of the other via, there is no unnecessary increase in the number of manufacturing processes.

In another embodiment of the component built-in board, the diameter of the heat radiation-dedicated via is set in a range of 60 μm to 500 μm.

A method of manufacturing a component built-in board according to an embodiment of the present invention, the component built-in board having stacked therein a plurality of printed wiring bases in which a wiring pattern and a via are formed on/in an insulating base and the component built-in board being configured having an electronic component built in thereto, comprises the steps of: forming the wiring pattern and the via on/in a plurality of the insulating bases; forming a heat radiation-dedicated wiring pattern as the wiring pattern on at least two layers of those of the plurality of insulating bases that are disposed on a rear surface side which is an opposite side to an electrode formation surface side of the electronic component, the heat radiation-dedicated wiring pattern being disposed in multiple layers via the insulating base on a region above the rear surface of the electronic component and being formed such that a heat radiation-dedicated wiring line and a signal-dedicated wiring line are continuous; forming a plurality of heat radiation-dedicated vias, as the via, that are connected to the rear surface of the electronic component and the heat radiation-dedicated wiring pattern; forming in at least one of the plurality of insulating bases an opening that has the electronic component built in thereto; stacking the at least two layers of the printed wiring bases that have the heat radiation-dedicated via and the heat radiation-dedicated wiring pattern formed on the rear surface side of the electronic component; performing thermal compression bonding to collectively stack the plurality of printed wiring bases such that the rear surface of the electronic component is connected to the heat radiation-dedicated wiring pattern disposed in the multiple layers via the heat radiation-dedicated via and such that the heat radiation-dedicated wiring pattern is continuous from a place where connected to the heat radiation-dedicated via to be connected also to another via disposed at an outer peripheral side of the electronic component.

The method of manufacturing a component built-in board according to the embodiment of the present invention results in the following, namely that disposed on a rear surface side which is an opposite side to an electrode formation surface side of an electronic component are at least two layers of printed wiring bases that each include multiple layers of a heat radiation-dedicated wiring pattern and a plurality of heat radiation-dedicated vias connected to the rear surface of the electronic component and the heat radiation-dedicated wiring pattern and that are formed such that the heat radiation-dedicated wiring pattern is formed such that a heat radiation-dedicated wiring line and a signal-dedicated wiring line are continuous and is continuous from a place where connected to the heat radiation-dedicated via to be connected also to another via disposed at an outer peripheral side of the electronic component, hence the method of manufacturing a component built-in board according to the embodiment of the present invention makes it possible to achieve an even higher degree of density and an even lower profiling of the board overall without sacrificing heat radiation characteristics of the component built-in board, makes it possible to raise heat radiation efficiency by increasing substantive heat radiation area, and makes it possible to further increase heat radiation effects by combination with another via, thereby enabling heat radiation characteristics to be further improved.

In an embodiment of the method of manufacturing a component built-in board, the heat radiation-dedicated via is formed having a larger diameter than the other via. As a result, a via (another via) and a heat radiation-dedicated via of larger diameter than this via can be formed in an identical process in the insulating base disposed on the rear surface side which is the opposite side to the electrode formation surface side of the electronic component, hence heat radiation characteristics can be improved without unnecessarily increasing the number of manufacturing processes. Moreover, since the diameter of the other via is smaller than that of the heat radiation-dedicated via, a degree of freedom in design of the wiring pattern and via can be improved, thereby enabling the board overall to be made more high density and lower profile.

In another embodiment of the method of manufacturing a component built-in board, the via and the heat radiation-dedicated via are formed by: laser processing in which a via hole of the via is formed and then a laser light output is adjusted to form a via hole of the heat radiation-dedicated via is formed; and conductive paste filling processing in which a conductive paste is filled into each of the formed via holes.

DESCRIPTION OF THE PREFERRED EMBODIMENTS

A component built-in board and a method of manufacturing the same according to embodiments of this invention will be described in detail below with reference to the accompanying drawings.

First Embodiment

Figure 1:
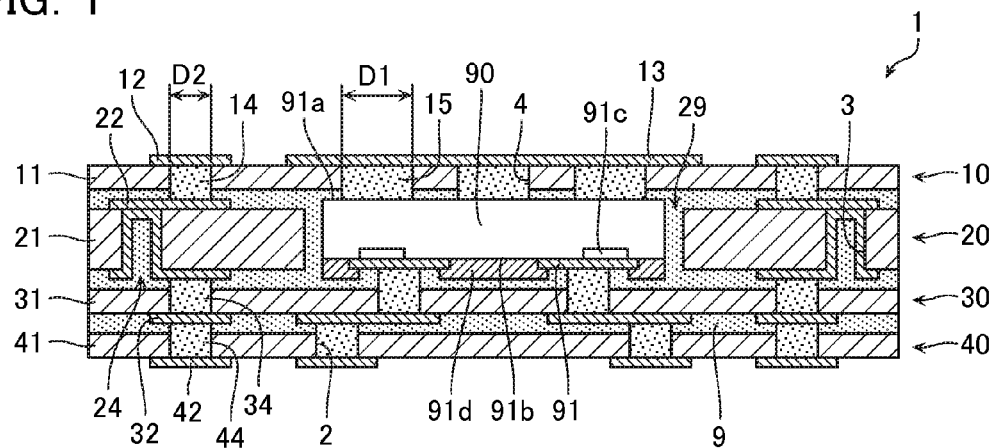
FIG. 1 is a cross-sectional view showing a structure of a component built-in board according to a first embodiment of the present invention.

FIG. 1 is a cross-sectional view showing a structure of a component built-in board according to a first embodiment of the present invention. As shown in FIG. 1, a component built-in board 1 according to the first embodiment comprises a structure in which a first printed wiring base 10, a second printed wiring base 20, a third printed wiring base 30, and a fourth printed wiring base 40 are stacked collectively by thermal compression bonding.

In addition, the component built-in board 1 comprises an electronic component 90 built in to an opening 29 formed in a second resin base 21 of the second printed wiring base 20, in a state of being sandwiched between the first and third printed wiring bases 10 and 30. The electronic component 90 is, for example, an active component configured from a semiconductor element such as a transistor, an integrated circuit (IC), a diode, and so on, or a passive component configured from a passive element such as a resistor, a capacitor, a relay, a piezoelectric element, and so on.

The first through fourth printed wiring bases 10 to 40 respectively comprise: a first resin base 11, the second resin base 21, a third resin base 31, and a fourth resin base 41 that act as insulating bases; and signal-dedicated wiring lines 12, 22, 32, and 42 formed on at least one surface of these first through fourth resin bases 11 to 41. In addition, the first through fourth printed wiring bases 10 to 40 comprise: signal-dedicated vias 14, 34, and 44 formed by filling a via hole 2 formed in the first, third, and fourth resin bases 11, 31, and 41, respectively; and a signal-dedicated via 24 formed in a via hole formed in the second resin base 21 so as to provide conduction between the two surfaces of the second resin base 21.

Furthermore, the first printed wiring base 10 comprises: a plurality of heat radiation-dedicated vias (thermal vias) 15 for heat radiation, formed by filling a via hole 4 formed in the first resin base 11; and a heat radiation-dedicated wiring line 13 formed on an identical surface to the signal-dedicated wiring line 12. Employable as these first through fourth printed wiring bases 10 to 40 are, for example, a single-sided copper clad laminated board (single-sided CCL) or a double-sided copper clad laminated board (double-sided CCL), and so on.

In the present example, the second printed wiring base 20 is formed based on a double-sided CCL, and the other printed wiring bases are formed based on a single-sided CCL. Therefore, the signal-dedicated wiring line 22 of the second printed wiring base 20 is formed on the two surfaces of the second resin base 21, and the signal-dedicated via 24 provides inter-layer connection between the signal-dedicated wiring line 22 of these two surfaces.

In this case, the signal-dedicated via 24 may be configured from, for example, an LVH plated via having a structure in which a plating is applied in a through-hole formed from a side of the signal-dedicated wiring line 22 on one surface without penetrating the signal-dedicated wiring line 22 on the other surface, and may be formed from, for example, a copper plating. At this time, a plating layer not illustrated is formed on the signal-dedicated wiring line 22 on the other surface. In addition, although omitted from FIG. 1, it is also possible to adopt a structure where the inside of the through-hole is filled with a conductive paste instead of being plated, or to configure by a plated through-hole having a structure in which a plating is applied in a through-hole that penetrates each of the signal-dedicated wiring lines 22.

The first through fourth resin bases 11 to 41 are each configured by, for example, a resin film having a thickness of about 25 μm. Now, employable as the resin film are, for example, a resin film configured from the likes of a polyimide, polyolefin, or liquid crystal polymer (LCP), or a resin film configured from a thermosetting epoxy resin, and so on.

The electronic component 90 is the likes of an active component or a passive component of the above-mentioned kind, and the electronic component 90 shown in FIG. 1 indicates a WLP (Wafer Level Package) that has been rewired. Provided on an electrode formation surface 91b of the electronic component 90 are a plurality of rewiring electrodes 91 each formed on a pad 91c. Moreover, formed in a periphery of the rewiring electrodes 91 is an insulating layer 91d.

Note that the signal-dedicated wiring lines 12, 22, 32, and 42, and the heat radiation-dedicated wiring line 13 are configured by pattern forming a conductive material such as copper foil. In addition, the signal-dedicated vias 14, 34, and 44, and the heat radiation-dedicated via 15 are configured from a conductive paste respectively filled into the via holes 2 and 4, and the signal-dedicated via 24 is formed by plating as described above. In the present example, the signal-dedicated wiring line and the signal-dedicated via are disposed at any place excluding a region above a rear surface 91a which is on an opposite side to the electrode formation surface 91b of the electronic component 90.

The conductive paste includes, for example, at least one kind of metallic particle of low electrical resistance selected from the likes of nickel, gold, silver, copper, aluminum, and iron, and at least one kind of metallic particle of low melting point selected from the likes of tin, bismuth, indium, and lead. Moreover, the conductive paste is configured from a paste having mixed into these metallic particles a binder component whose main component is an epoxy, an acrylic, a urethane, and so on.

The conductive paste configured in this way enables the metal of low melting point contained therein to melt and form an alloy at a temperature of 200° C. or less, specifically the likes of copper or silver comprise characteristics allowing an intermetallic compound to be formed. Therefore, a connection between each of the vias and the wiring lines is alloyed by an intermetallic compound during thermal compression bonding of collective stacking.

Note that the conductive paste may also be configured by a nanopaste in which, for example, a filler of the likes of gold, silver, copper, or nickel with a nanolevel particle diameter is mixed into a binder component of the above-described kind.

In addition, the conductive paste may also be configured by a paste having metallic particles of the above-described nickel, and so on, mixed into a binder component of the above-described kind.

In this case, the conductive paste is characterized in that electrical connection is performed by contact between fellow metallic particles. Employable as a method of filling the conductive paste into the via holes 2 and 4 or the through-hole is, for example, a printing method, a spin coating method, a spray coating method, a dispensing method, a laminating method, a method combining use of these methods, and so on.

Note that the first through fourth printed wiring bases 10 to 40 are stacked via an adhesive layer 9 provided beforehand in the first, third, and fourth printed wiring bases 10, 30, and 40. The adhesive layer 9 is configured from a thermosetting resin.

Moreover, the electronic component 90 disposed in the opening 29 of the second printed wiring base 20 is fixed in the opening 29 by the adhesive layer 9 in a state where the rear surface 91*a* which is on an opposite side to the electrode formation surface 91*b* is connected to the heat radiation-dedicated via 15 of the first printed wiring base 10. Note that as described above, a connection between the heat radiation-dedicated wiring line 13 and the heat radiation-dedicated via 15 is alloyed by an intermetallic compound.

The heat radiation-dedicated via 15 is formed such that its diameter D1 is larger than a diameter D2 of other vias 14, 34, and 44. This diameter D1 of the heat radiation-dedicated via 15 is set to a magnitude in a range of 60 μm to 500 μm, and, for example, about 100 μm to 300 μm is considered preferable from a practical viewpoint. In the present example, if the diameter D2 is assumed to be about 30 μm to 80 μm, then the diameter D1 is set to about 100 μm to 150 μm.

The component built-in board 1 configured in this way results in a structure in which the electronic component 90 is connected to the heat radiation-dedicated wiring line 13 formed on a front surface of the first printed wiring base 10, via the heat radiation-dedicated via 15 directly connected to the rear surface 91*a*. The heat radiation-dedicated via 15 is formed having a larger diameter than the other vias 14, 34, and 44, hence has a smaller thermal resistance and a higher thermal conductivity. Therefore, heat generated by the electronic component 90 built in to the component built-in board 1 is dissipated efficiently into the atmosphere from the heat radiation-dedicated wiring line 13 via the heat radiation-dedicated via 15 directly connected to the rear surface 91*a*. As a result, heat radiation characteristics are extremely good. Moreover, such a structure makes it possible to achieve a higher density and lower profiling of the board overall while improving heat radiation characteristics.

Next, a method of manufacturing the component built-in board 1 according to the first embodiment will be described.

Figure 2:
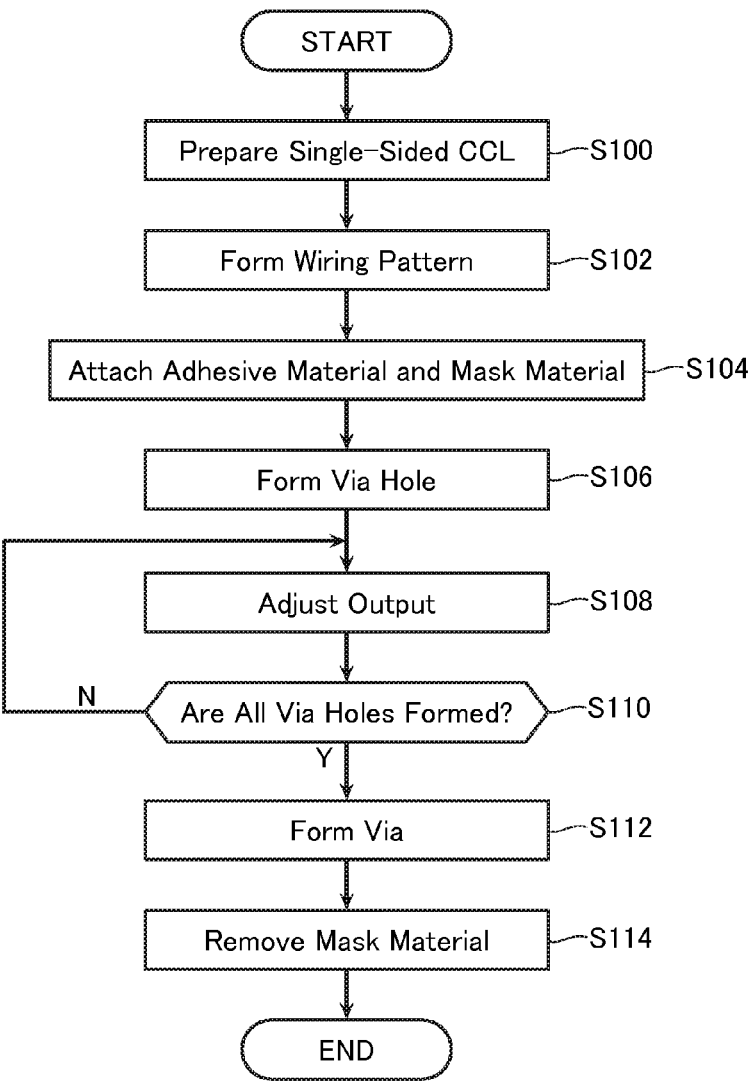
FIG. 2 is a flowchart showing a manufacturing process of same component built-in board.
Figure 3:
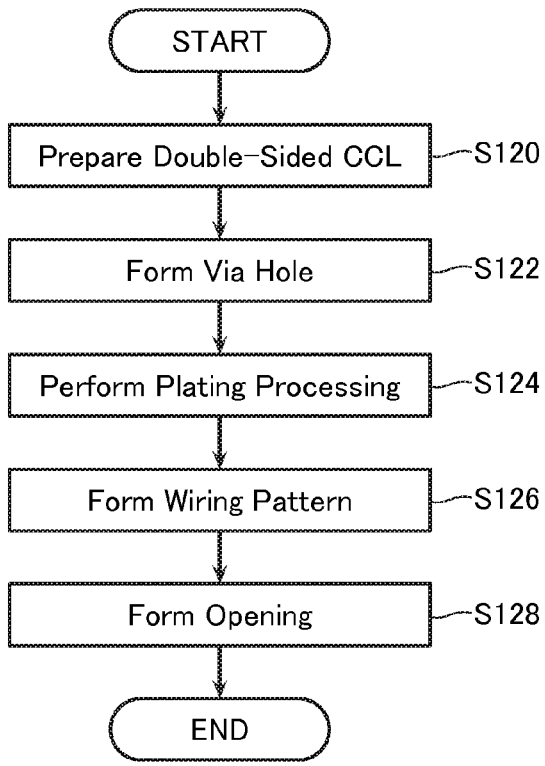
FIG. 3 is a flowchart showing a manufacturing process of same component built-in board.
Figure 4:
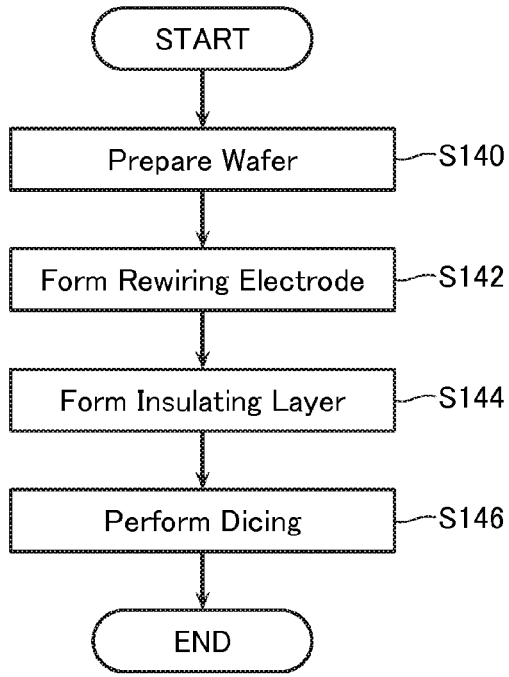
FIG. 4 is a flowchart showing a manufacturing process of an electronic component in the manufacturing process of same component built-in board.
Figure 5:
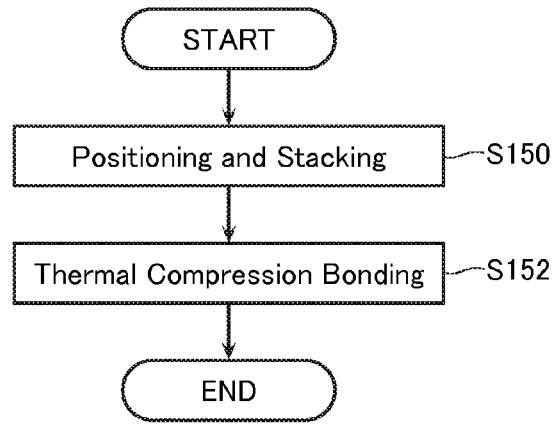
FIG. 5 is a flowchart showing a manufacturing process of same component built-in board.

FIGS. 2, 3, and 5 are each a flowchart showing a manufacturing process of the component built-in board, and FIG. 4 is a flowchart showing a manufacturing process of the electronic component in the manufacturing process of the component built-in board. Moreover, FIGS. 6A, 6B, 6C, 6D, 6E, 7A, 7B, 7C, 7D, 7E, and 9 are each a cross-sectional view showing the component built-in board on a manufacturing process basis, and FIGS. 8A, 8B, 8C, and 8D are each a cross-sectional view showing the electronic component built in to the component built-in board, on a manufacturing process basis.

Figure 7A:
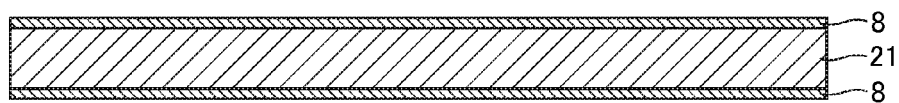
FIG. 7A is a cross-sectional view showing same component built-in board on a manufacturing process basis.
Figure 7B:
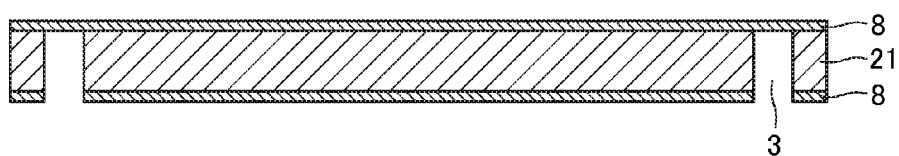
FIG. 7B is a cross-sectional view showing same component built-in board on a manufacturing process basis.

Note that FIGS. 2 and 6A to 6E show details of the manufacturing process of the first printed wiring base 10; FIGS. 3 and 7A to 7E show details of the manufacturing process of the second printed wiring base 20; FIGS. 4 and 8A to 8D show details of the manufacturing process of the electronic component 90; and FIGS. 5 and 9 show details of the manufacturing process of a final process of the component built-in board 1. The third and fourth printed wiring bases 30 and 40 can be manufactured by a similar process to the manufacturing process of the first printed wiring base 10, hence unless specifically mentioned, a description of the manufacturing process of the third and fourth printed wiring bases 30 and 40 is omitted.

Figure 6A:
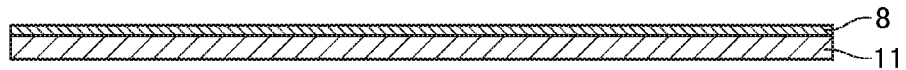
FIG. 6A is a cross-sectional view showing same component built-in board on a manufacturing process basis.
Figure 6B:
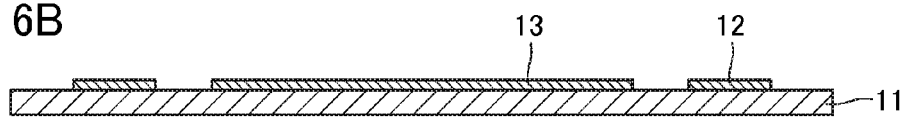
FIG. 6B is a cross-sectional view showing same component built-in board on a manufacturing process basis.

First, the manufacturing process of the first printed wiring base 10 will be described with reference to FIG. 2. As shown in FIG. 6A, a single-sided CCL in which a conductor layer 8 configured from the likes of a solid-state copper foil is formed on one surface of the first resin base 11, is prepared (step S100). Next, an etching resist is formed on the conductor layer 8 by photolithography, and then, as shown in FIG. 6B, etching is performed to form a wiring pattern of the signal-dedicated wiring line 12 and the heat radiation-dedicated wiring line 13, and so on (step S102).

The single-sided CCL used in step S100 is, for example, configured from a structure in which the first resin base 11 having a thickness of about 25 μm is affixed to the conductor layer 8 configured from copper foil having a thickness of about 12 μm. Usable as this single-sided CCL is, for example, a single-sided CCL prepared by applying a varnish of polyimide to copper foil and hardening the varnish, by a publicly known casting method.

Otherwise employable as the single-sided CCL are the likes of a single-sided CCL in which a seed layer is formed on a polyimide film by sputtering and the conductor layer 8 is formed by growing copper by plating, or a single-sided CCL prepared by attaching a rolled or electrolytic copper foil and a polyimide film by an adhesive material.

Note that the first resin base 11 is not necessarily required to be configured from a polyimide, and as described above, may be configured from a plastic film of a liquid crystal polymer, or the like. Moreover, an etchant whose main component is ferric chloride or cupric chloride may be employed in the etching in step S102.

Figure 6C:
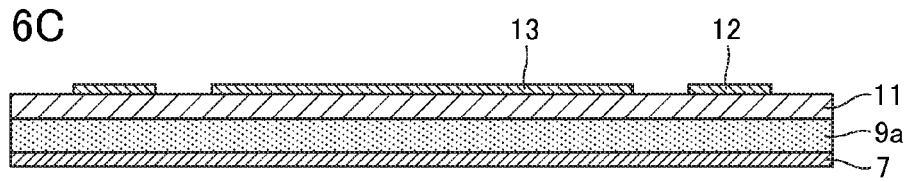
FIG. 6C is a cross-sectional view showing same component built-in board on a manufacturing process basis.

As shown in FIG. 6C, after the wiring pattern has been formed, an adhesive material 9*a* and a mask material 7 are attached, by thermal compression bonding, to a surface on an opposite side to a side of formation of the signal-dedicated wiring line 12 and the heat radiation-dedicated wiring line 13 of the first resin base 11 (step S104). Employable as the adhesive material 9*a* attached in step S104 is, for example, an epoxy system thermosetting film having a thickness of about 25 μm. The thermal compression bonding includes employing a vacuum laminator to press and attach these in a reduced pressure atmosphere, at a temperature where the adhesive material 9*a* does not harden, by a pressure of 0.3 MPa.

Note that an interlayer adhesive material employed as the adhesive layer 9 or the adhesive material 9*a* includes not only an epoxy system thermosetting resin, but also the likes of an acrylic system adhesive material or a thermoplastic adhesive material typified by a thermoplastic polyimide, or the like. Moreover, the interlayer adhesive material is not necessarily required to be in a film state, and may have resin coated in a varnish state. Employable as the mask material 7 are various kinds of films capable of adhesion or detachment by UV irradiation, as well as the above-mentioned resin film or plastic film of PET, PEN, and so on.

Figure 6D:
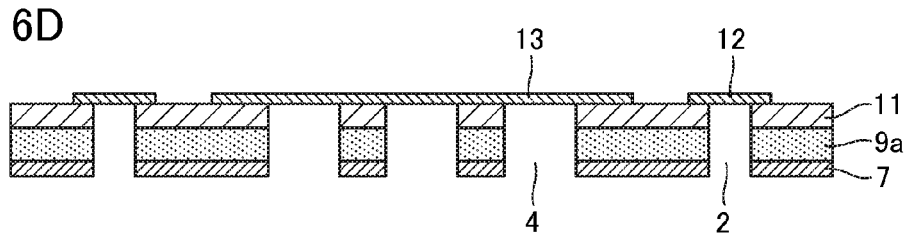
FIG. 6D is a cross-sectional view showing same component built-in board on a manufacturing process basis.

Then, as shown in FIG. 6D, a UV-YAG laser device, for example, is employed to irradiate laser light from an attached mask material 7 side first toward the signal-dedicated wiring line 12, whereby the via hole 2 penetrating the mask material 7, the adhesive material 9*a* and the first resin base 11 is formed at a certain place (step S106). The via hole 2 at this time is formed such that the diameter D2 is about 30 μm to 80 μm.

Subsequently, a laser light output of the UV-YAG laser device is adjusted (step S108); it is determined whether all of the via holes 2 and 4 have been formed or not (step S110); and if it is determined that they have not all been formed (N of step S110), the above-described step S106 is shifted to, and output readjusted laser light is irradiated to form the via hole 4.

That is, the output adjusted laser light is irradiated toward the heat radiation-dedicated wiring line 13 so as to penetrate the mask material 7, the adhesive material 9a, and the first resin base 11, to form the via hole 4 having the diameter D1 of about 100 μm to 150 μm, at a certain place. Note that the formed via holes 2 and 4 undergo plasma desmear processing after their formation.

The via holes 2 and 4 formed in step S106 may otherwise by formed by the likes of a carbon dioxide gas laser ($CO_2$ laser) or an excimer laser, or may be formed by the likes of drill processing or chemical etching. Moreover, the desmear processing can be performed by a mixed gas of $CF_4$ and $O_2$ (tetrafluoromethane+oxygen), but may also employ another inert gas such as Ar (argon), and may be configured as wet desmear processing employing a chemical, rather than so-called dry processing.

Figure 6E:
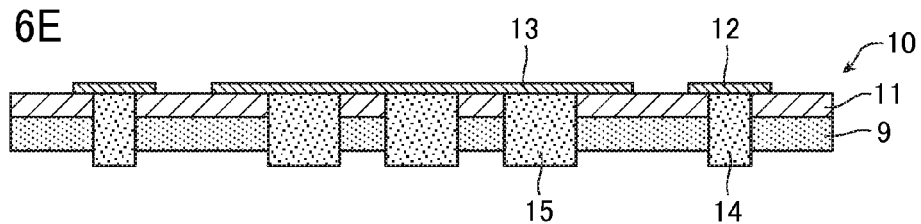
FIG. 6E is a cross-sectional view showing same component built-in board on a manufacturing process basis.

If it is determined that all of the via holes 2 and 4 have been formed (Y of step S110), the above-described conductive paste is filled into the formed via holes 2 and 4 by, for example, screen printing, or the like, to form the various kinds of vias, that is the signal-dedicated via 14 and the heat radiation-dedicated via 15 (step S112), and, as shown in FIG. 6E, the mask material 7 is removed by peeling (step S114), whereby a series of processings according to the present flowchart finishes.

As a result of such a process, the signal-dedicated via 14 and the heat radiation-dedicated via 15 of larger diameter than this signal-dedicated via 14 being in a state where their ends protrude slightly from a surface of the adhesive layer 9 are formed, whereby the first printed wiring base 10 including the first resin base 11 provided with the adhesive layer 9 can be manufactured. Note that the third and fourth printed wiring bases 30 and 40 can be manufactured by the above-described process skipping steps S108 and S110. Moreover, in the case of even more layers, it is only required to prepare by forming additional printed wiring bases.

Next, the manufacturing process of the second printed wiring base 20 will be described with reference to FIG. 3. Note that places already described are assigned with identical symbols and a description of such places is sometimes omitted, and that above-described content may be applied to specific processing content of each of the steps. First, as shown in FIG. 7A, a double-sided CCL in which the conductor layer 8 is formed on both surfaces of the second resin base 21 is prepared (step S120), then, as shown in FIG. 7B, the via hole 3 is formed at a certain place (step S122), and plasma desmear processing is performed.

Figure 7C:
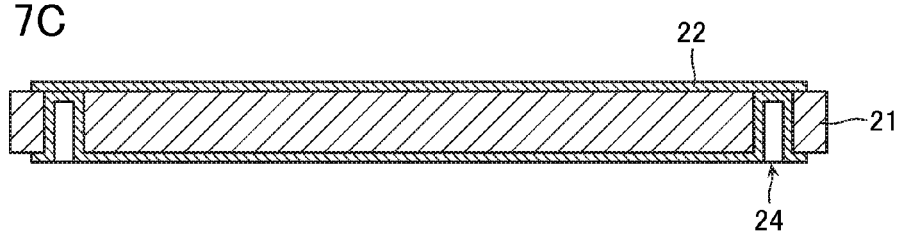
FIG. 7C is a cross-sectional view showing same component built-in board on a manufacturing process basis.
Figure 7D:
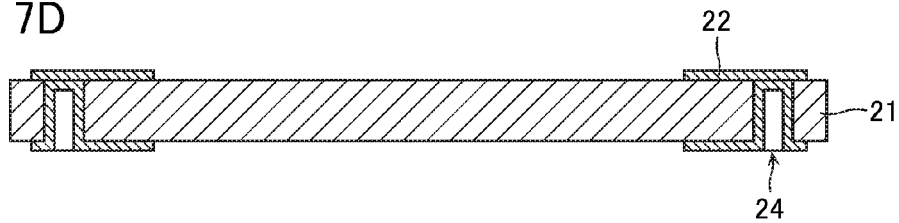
FIG. 7D is a cross-sectional view showing same component built-in board on a manufacturing process basis.
Figure 8A:
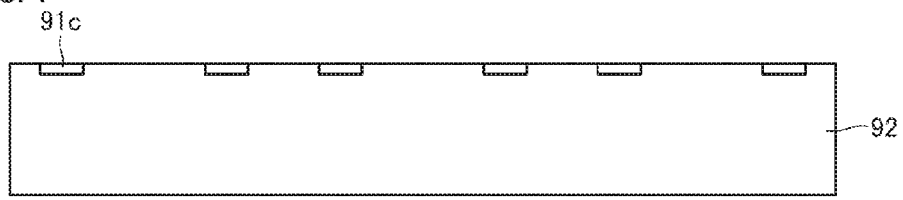
FIG. 8A is a cross-sectional view showing the electronic component built in to same component built-in board, on a manufacturing process basis.

Next, as shown in FIG. 7C, panel plate processing is performed on both entire surfaces of the second resin base 21 (step S124) to form a plating layer not illustrated, on the conductor layer 8 and in the via hole 3, and thereby form a prototype of the signal-dedicated wiring line 22 and the signal-dedicated via 24. Then, as shown in FIG. 7D, etching, and so on, is performed on both surfaces of the second resin base 21 to form a wiring pattern of the signal-dedicated wiring line 22 and the signal-dedicated via 24, and so on (step S126).

Figure 7E:
FIG. 7E is a cross-sectional view showing same component built-in board on a manufacturing process basis.

Finally, as shown in FIG. 7E, the second resin base 21 at a portion thereof where the electronic component 90 is to be built in is removed by irradiating with laser light using the UV-YAG laser device, or the like, to form the opening 29 having a certain opening diameter (step S128), whereby a series of processings according to the present flowchart finishes. This allows the second printed wiring base 20 to be manufactured.

The electronic component 90 built in to the opening 29 of the second printed wiring base 20 manufactured in this way is manufactured, for example, as follows. The manufacturing process of the electronic component 90 will be described with reference to FIG. 4. First, as shown in FIG. 8A, a pre-dicing wafer 92 having formed therein an inorganic insulating layer of silicon oxide or silicon nitride, and so on, is prepared (step S140).

Figure 8B:
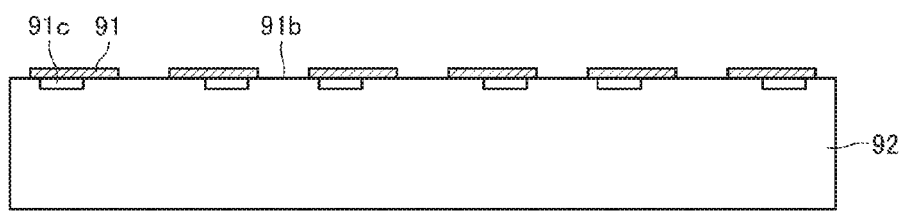
FIG. 8B is a cross-sectional view showing the electronic component built in to same component built-in board, on a manufacturing process basis.
Figure 9:
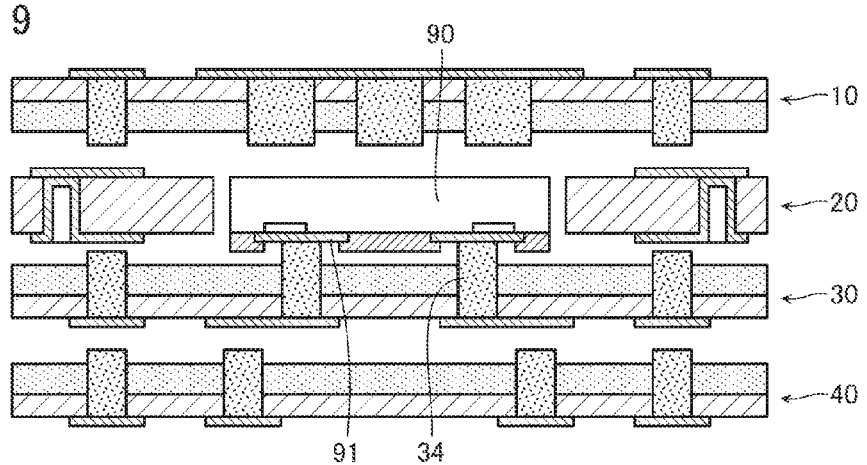
FIG. 9 is a cross-sectional view showing same component built-in board on a manufacturing process basis.

As shown in FIG. 8B, after the wafer 92 has been prepared, the rewiring electrode 91 covering a conductor circuit (not illustrated) or the pad 91c above the pad 91c of the electronic component 90 and above the inorganic insulating layer is formed on a surface of the prepared wafer 92 by, for example, a semi-additive method (step S142).

Figure 8C:
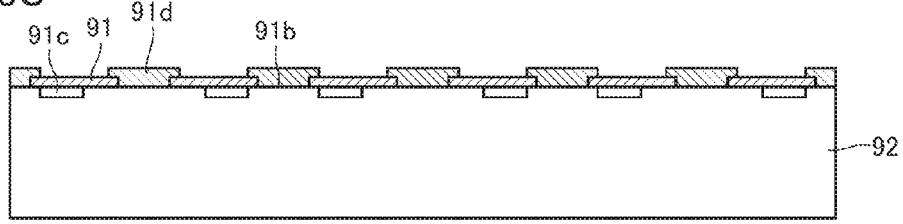
FIG. 8C is a cross-sectional view showing the electronic component built in to same component built-in board, on a manufacturing process basis.
Figure 8D:
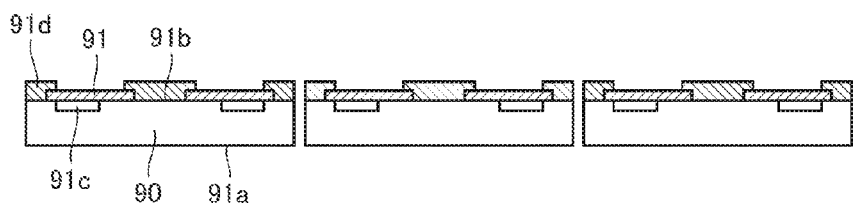
FIG. 8D is a cross-sectional view showing the electronic component built in to same component built-in board, on a manufacturing process basis.

Then, as shown in FIG. 8C, a contact hole is formed by, for example, spin-coating a liquid-form photosensitive polyimide precursor and performing photolithography, and then the insulating layer 91d is formed by calcination (step S144). Finally, testing is performed by probing, and as shown in FIG. 8D, the electronic component 90 is formed into an individual piece by thinning and dicing (step S146).

Note that employable as resin of the insulating layer 91d formed in step S144 are, for example, benzo-cyclo-butene (BCB) or poly-benzo-oxazole (PBO), and so on. Moreover, the photosensitive resin does not necessarily need to be coated by spin coating, and may be coated by curtain coating or screen printing, or by spray coating, and so on. The electronic component 90 produced in this way may also be provided with various functions of an inductor, a capacitor, a resistance, and so on, as well as an ordinary conductive circuit.

When the first through fourth printed wiring bases 10 to 40 and the electronic component 90 have been produced in this way, then as shown in FIG. 9, the rewiring electrode 91 of the electronic component 90 and the signal-dedicated via 34 of the third printed wiring base 30 are aligned by an electronic component mounting device, and the electronic component 90 is provisionally adhered to the third printed wiring base 30 in a state where the adhesive layer 9 of the third printed wiring base 30 and the conductive paste of the signal-dedicated via 34 are unhardened.

Then, as shown in FIG. 5, each of the printed wiring bases 10 to 40 and the electronic component 90 are positioned and stacked (step S150). Finally, for example, a vacuum press is employed to collectively stack by thermal compression bonding by applying heat and pressure in a reduced pressure atmosphere of 1 kPa or less (step S152), whereby a series of processings according to the present flowchart finishes and the component built-in board 1 of the kind shown in FIG. 1 is manufactured.

During collective stacking, hardening and alloying of the conductive paste filled into the via holes 2 and 4 is performed simultaneously to hardening of each of the interlayer adhesive layers 9 or each of the resin bases 21 and 31, and so on. Therefore, an alloy layer of an intermetallic compound is formed between the heat radiation-dedicated via 15 configured from the conductive paste and the heat radiation-dedicated wiring line 13 contacting the heat radiation-dedicated via 15 or other vias and wiring lines, and so on.

Second Embodiment

Figure 10:
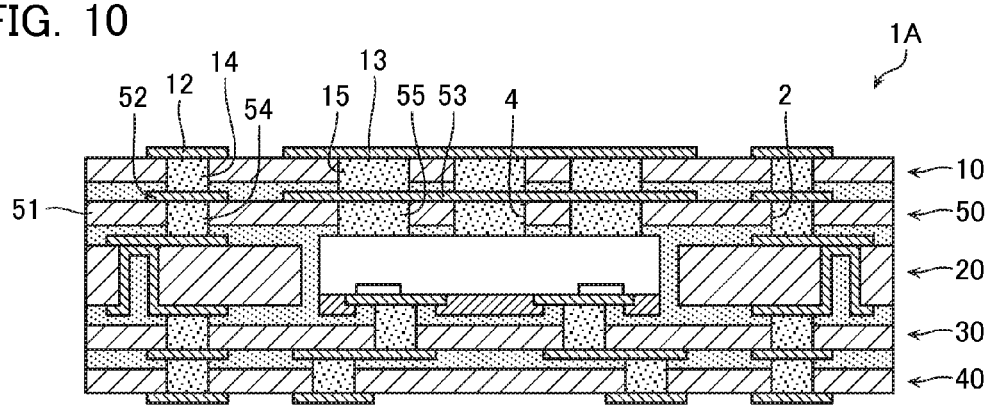
FIG. 10 is a cross-sectional view showing a structure of a component built-in board according to a second embodiment of the present invention.

FIG. 10 is a cross-sectional view showing a structure of a component built-in board 1A according to a second embodiment of the present invention. The component built-in board 1A according to the second embodiment differs from the component built-in board 1 according to the first embodiment in having a fifth printed wiring base 50 further stacked between the first and second printed wiring bases 10 and 20.

The fifth printed wiring base 50 is configured from, for example, a single-sided CCL, comprises a fifth resin base 51, and a signal-dedicated wiring line 52 and heat radiation-dedicated wiring line 53 formed on one surface of this fifth resin base 51, and can be manufactured similarly to the first printed wiring base 10. In addition, the fifth printed wiring base 50 comprises a signal-dedicated via 54 and a heat radiation-dedicated via 55 of larger diameter than this signal-dedicated via 54 that are configured from a conductive paste and are formed by respectively filling in the via holes 2 and 4 that are formed penetrating the fifth resin base 51 in respective directions of the signal-dedicated wiring line 52 and the heat radiation-dedicated wiring line 53.

One end of the heat radiation-dedicated via 55 is connected to the rear surface 91a of the electronic component 90. Therefore, heat of the electronic component 90 is transferred via the heat radiation-dedicated via 55 to the heat radiation-dedicated wiring line 53 and passes through the heat radiation-dedicated via 15 of the first printed wiring base 10 connected to this heat radiation-dedicated wiring line 53 to be dissipated to external from the heat radiation-dedicated wiring line 13.

If such a configuration is adopted, heat of the electronic component 90 can be efficiently dissipated similarly to in the component built-in board 1 according to the first embodiment, even if the rear surface 91a of the electronic component 90 is not disposed in a close vicinity of the first printed wiring base 10 located in a surface layer of the component built-in board 1A, that is, even if the electronic component 90 is disposed in a deep inner layer of the component built-in board 1A. In this case, it is made possible to achieve an even higher density and lower profiling of the board overall without sacrificing heat radiation characteristics.

Note that a plurality of the fifth printed wiring bases 50 may be further provided. Moreover, in order to reduce thermal resistance, the heat radiation-dedicated vias 15 and 55 are provided linearly from the rear surface 91a of the electronic component 90 in a direction of the heat radiation-dedicated wiring line 13, but may be formed configuring another shape (for example, a crank shape). Furthermore, the number of heat radiation-dedicated vias 15 and 55 in each of the printed wiring bases 10 and 50 is not necessarily required to be the same (three in FIG. 10), and it is only required that the heat radiation-dedicated vias 15 and 55 are electrically (thermally) connected.

Third Embodiment

Figure 11:
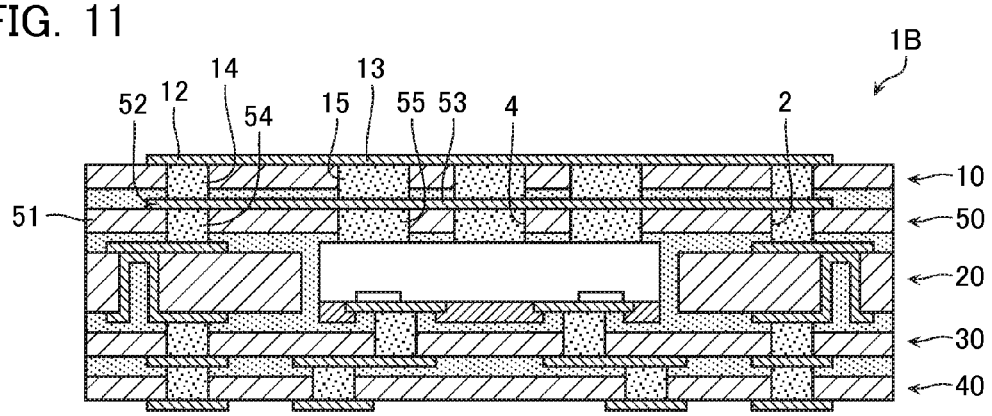
FIG. 11 is a cross-sectional view showing a structure of a component built-in board according to a third embodiment of the present invention.

FIG. 11 is a cross-sectional view showing a structure of a component built-in board 1B according to a third embodiment of the present invention. The component built-in board 1B according to the third embodiment is similar to the component built-in board 1A according to the second embodiment in having the fifth printed wiring base 50 further stacked between the first and second printed wiring bases 10 and 20, but differs from the component built-in board 1A according to the second embodiment as follows.

That is, as shown in FIG. 11, in the component built-in board 1B, the signal-dedicated wiring lines 12 and 52 and the heat radiation-dedicated wiring lines 13 and 53 respectively formed on one surface of the first and fifth resin bases 11 and 51 of the first and fifth printed wiring bases 10 and 50 are formed in a continuous state. As a result, heat of the electronic component 90 is transferred via the heat radiation-dedicated via 55 to the heat radiation-dedicated wiring line 53 and the signal-dedicated wiring line 52 continuous with this heat radiation-dedicated wiring line 53, and passes through the heat radiation-dedicated via 15 and the signal-dedicated via 14 of the first printed wiring base 10 connected to these heat radiation-dedicated wiring line 53 and signal-dedicated wiring line 52 to be dissipated to external from the heat radiation-dedicated wiring line 13 and the signal-dedicated wiring line 12 continuous with this heat radiation-dedicated wiring line 13. Therefore, it is made possible to raise heat radiation efficiency by expanding a substantive heat radiation area of the heat radiation-dedicated wiring lines 13 and 53 of each of the printed wiring bases 10 and 50, and to increase a heat radiation effect by combination with the heat radiation-dedicated vias 15 and 55 of larger diameter than the other vias, thereby further improving heat radiation characteristics.

Fourth Embodiment

Figure 12:
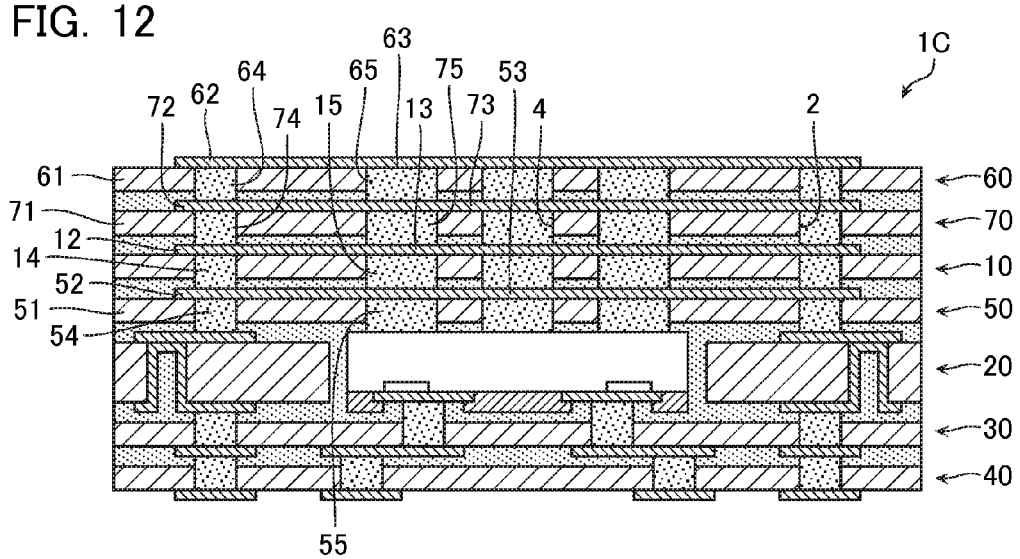
FIG. 12 is a cross-sectional view showing a structure of a component built-in board according to a fourth embodiment of the present invention.

FIG. 12 is a cross-sectional view showing a structure of a component built-in board 1C according to a fourth embodiment of the present invention. The component built-in board 1C according to the fourth embodiment differs from the component built-in board 1B according to the third embodiment in having sixth and seventh printed wiring bases 60 and 70 further stacked on the first printed wiring base 10.

As shown in FIG. 12, the sixth and seventh printed wiring bases 60 and 70 are configured from, for example, a single-sided CCL, and comprise sixth and seventh resin bases 61 and 71, and signal-dedicated wiring lines 62 and 72 and heat radiation-dedicated wiring lines 63 and 73 formed on one surface of these sixth and seventh resin bases 61 and 71. In addition, the sixth and seventh printed wiring bases 60 and 70 comprise signal-dedicated vias 64 and 74 and heat radiation-dedicated vias 65 and 75 of larger diameter than these signal-dedicated vias 64 and 74, that are configured from a conductive paste and are formed by respectively filling in the via holes 2 and 4 that are formed penetrating the sixth and seventh resin bases 61 and 71 in respective directions of the signal-dedicated wiring lines 62 and 72 and the heat radiation-dedicated wiring lines 63 and 73.

In the component built-in board 1C configured in this way, the signal-dedicated wiring lines 62 and 72 and the heat radiation-dedicated wiring lines 63 and 73 respectively formed on one surface of the sixth and seventh resin bases 61 and 71 are formed in a continuous state not only in the first and fifth printed wiring bases 10 and 50 but also in the sixth and seventh printed wiring bases 60 and 70.

As a result, heat of the electronic component 90 is transferred via the heat radiation-dedicated via 55 to the heat radiation-dedicated wiring line 53 and the signal-dedicated wiring line 52 continuous with this heat radiation-dedicated wiring line 53, and passes through the heat radiation-dedicated vias 15, 75, and 65 and the signal-dedicated vias 14, 74, and 64 of the first, seventh, and sixth printed wiring bases 10, 70, and 60 connected to these heat radiation-dedicated wiring line 53 and signal-dedicated wiring line 52 to be dissipated to external from the heat radiation-dedicated wiring line 63 and the signal-dedicated wiring line 62 continuous with this heat radiation-dedicated wiring line 63. Therefore, it is made possible to raise heat radiation efficiency by expanding a substantive heat radiation area of the heat radiation-dedicated wiring lines 13, 53, 63, and 73 of each of the printed wiring bases 10, 50, 60, and 70, and to increase a heat radiation effect by combination with the heat radiation-dedicated vias 15, 55, 65, and 75 of larger diameter than the other vias, thereby further improving heat radiation characteristics.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A component built-in board that has stacked therein a plurality of printed wiring bases in which a wiring pattern and a via are formed on/in an insulating base and that is configured having an electronic component built in thereto, wherein
    at least two layers of the plurality of printed wiring bases are disposed on a rear surface side which is an opposite side to an electrode formation surface side of the electronic component;
    the at least two layers of the printed wiring bases disposed on the rear surface side of the electronic component include a heat radiation-dedicated wiring pattern as the wiring pattern that is disposed in multiple layers via the insulating base on a region above the rear surface of the electronic component;
    the heat radiation-dedicated wiring pattern is formed such that a heat radiation-dedicated wiring line and a signal-dedicated wiring line are continuous;
    the via includes a plurality of heat radiation-dedicated vias that are disposed on the region above the rear surface to connect the rear surface of the electronic component and the heat radiation-dedicated wiring pattern disposed in multiple layers; and
    the heat radiation-dedicated wiring pattern is continuous from a place where connected to the heat radiation-dedicated via to be connected also to another via disposed at an outer peripheral side of the electronic component.

2. The component built-in board according to claim 1, wherein
    the heat radiation-dedicated via has a larger diameter than the other via.

3. The component built-in board according to claim 1, wherein
    the diameter of the heat radiation-dedicated via is set in a range of 60 µm to 500 µm.

4. A method of manufacturing a component built-in board, the component built-in board having stacked therein a plurality of printed wiring bases in which a wiring pattern and a via are formed on/in an insulating base and the component built-in board being configured having an electronic component built in thereto, the method comprising the steps of:
    forming the wiring pattern and the via on/in a plurality of the insulating bases;
    forming a heat radiation-dedicated wiring pattern as the wiring pattern on at least two layers of those of the plurality of insulating bases that are disposed on a rear surface side which is an opposite side to an electrode formation surface side of the electronic component, the heat radiation-dedicated wiring pattern being disposed in multiple layers via the insulating base on a region above the rear surface of the electronic component and being formed such that a heat radiation-dedicated wiring line and a signal-dedicated wiring line are continuous;
    forming a plurality of heat radiation-dedicated vias, as the via, that are connected to the rear surface of the electronic component and the heat radiation-dedicated wiring pattern;
    forming in at least one of the plurality of insulating bases an opening that has the electronic component built in thereto;
    stacking the at least two layers of the printed wiring bases that have the heat radiation-dedicated via and the heat radiation-dedicated wiring pattern formed on the rear surface side of the electronic component;
    performing thermal compression bonding to collectively stack the plurality of printed wiring bases such that the rear surface of the electronic component is connected to the heat radiation-dedicated wiring pattern disposed in the multiple layers via the heat radiation-dedicated via such that the heat radiation-dedicated wiring pattern is continuous from a place where connected to the heat radiation-dedicated via to be connected also to another via disposed at an outer peripheral side of the electronic component.

5. The method of manufacturing a component built-in board according to claim 4, wherein
    the heat radiation-dedicated via is formed having a larger diameter than the other via.

6. The method of manufacturing a component built-in board according to claim 4, wherein
    the via and the heat radiation-dedicated via are formed by: laser processing in which a via hole of the via is formed and then a laser light output is adjusted to form a via hole of the heat radiation-dedicated via is formed; and conductive paste filling processing in which a conductive paste is filled into each of the formed via holes.

* * * * *